United States Patent
David et al.

(10) Patent No.: US 9,742,182 B1
(45) Date of Patent: Aug. 22, 2017

(54) ACCLIMATION SENSING AND CONTROL OF ELECTRONIC EQUIPMENT

(71) Applicant: International Business Machines Corporation, Armonk, NY (US)

(72) Inventors: Milnes P David, Poughkeepsie, NY (US); William J Green, Cary, NC (US); Joseph F Prisco, Rochester, MN (US); Brian P Rawson, East Amherst, NY (US); Robert T Sanders, Wilmington, NC (US); Sharon T Spaulding, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/228,192

(22) Filed: Aug. 4, 2016

(51) Int. Cl.
| | |
|---|---|
| H01H 83/00 | (2006.01) |
| H02H 5/08 | (2006.01) |
| H05K 5/02 | (2006.01) |
| H05K 5/00 | (2006.01) |
| H02H 5/04 | (2006.01) |

(52) U.S. Cl.
CPC ............ *H02H 5/083* (2013.01); *H02H 5/047* (2013.01); *H05K 5/0017* (2013.01); *H05K 5/0217* (2013.01); *H05K 5/0247* (2013.01); *H02H 5/04* (2013.01)

(58) Field of Classification Search
CPC ...... H02H 5/04; H02H 5/047; H02H 5/08; H02H 5/083
See application file for complete search history.

(56) References Cited

U.S. PATENT DOCUMENTS

| | | | |
|---|---|---|---|
| 2010/0033295 A1* | 2/2010 | Kent | ............... H01H 37/765 337/405 |
| 2015/0016001 A1 | 1/2015 | Quirk et al. | |

FOREIGN PATENT DOCUMENTS

DE      3828000 A1    2/1990

\* cited by examiner

*Primary Examiner* — Daniel Cavallari
(74) *Attorney, Agent, or Firm* — Damion Josephs

(57) ABSTRACT

Embodiments are directed to apparatuses used with a computer-implemented method for controlling power flow to an electronic device, including: receiving a transmission from a service processing device, the transmission to trigger an open switch between the electronic device and a power supply; and causing an open switch to occur through use of an interlock mechanism. Embodiments provide a temperature-driven interlock mechanism and moisture-driven interlock mechanism.

17 Claims, 4 Drawing Sheets

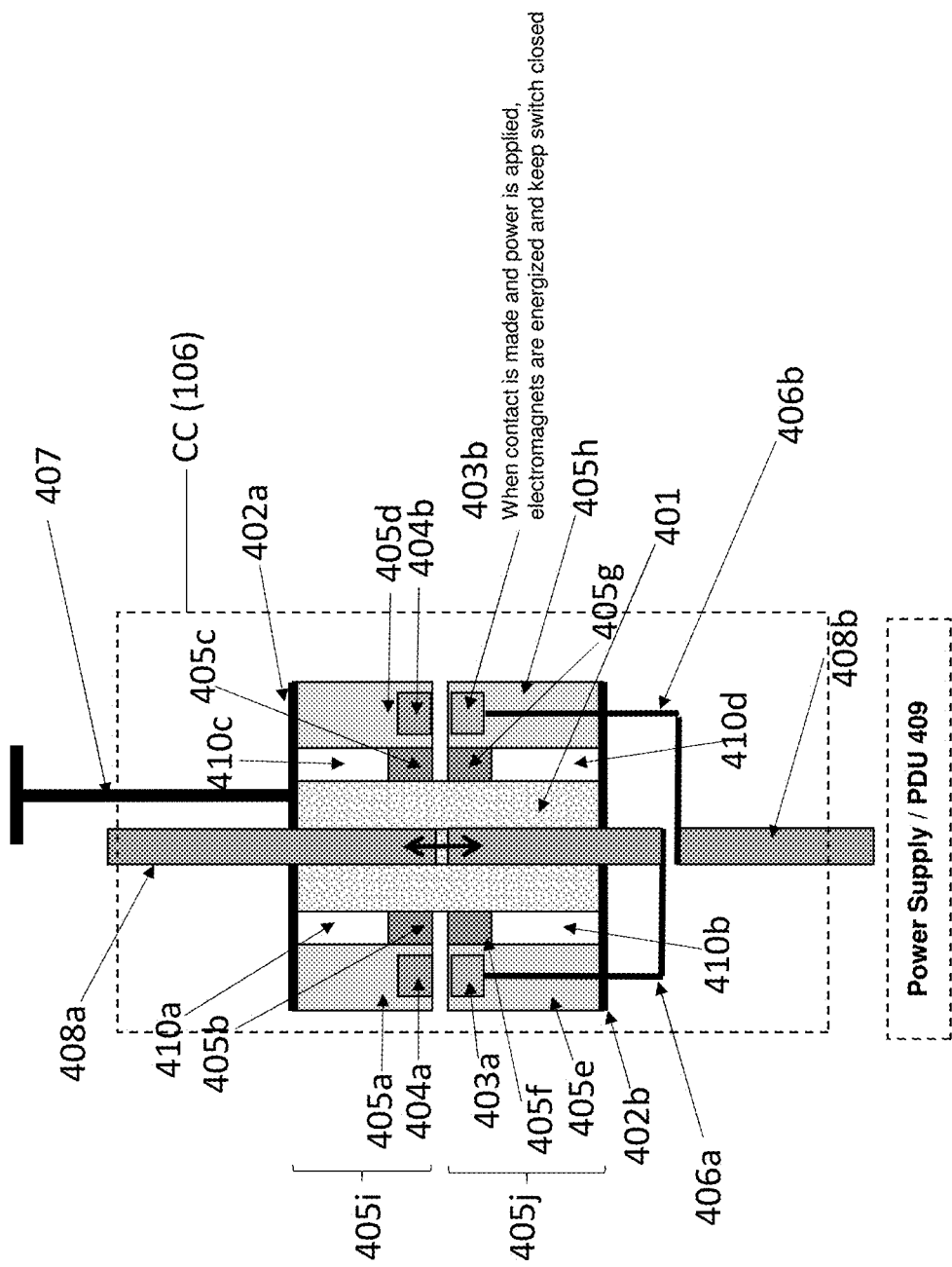

ACCLIMATION SENSING AND CONTROL OF ELECTRONIC EQUIPMENT

BACKGROUND OF THE INVENTION

1. Field of the Invention

Embodiments relate to computerized control units, and more specifically, to sensors used to obtain measurements and circuitry to control power flow to powered equipment.

2. Description of the Related Art

Shipments of electronic equipment are often made in cold climates. The equipment may be subject to cooling during transportation in the cold weather. After being in a colder environment, when the equipment enters a warmer (e.g., indoor) environment, various components and compartments of the equipment may be subject to effects of condensation (e.g., creation of moisture) and fluctuations in physical temperature. The presence of moisture, for example, presents risks to the equipment, especially during the power-on sequence of the equipment.

SUMMARY OF THE INVENTION

According to one as aspect, an apparatus to prevent a flow of power to an electronic device is provided. The apparatus a flexible, fluid-filled probe tube; a spiral, fluid-filled tube, mechanically and fluidically attached to the probe tube; a canister, in which the probe tube and spiral fluid-filled tube are enclosed; an electrically insulative element, where the insulative element is mechanically attached at a first end, within the canister, to a first end of the spiral tube, and wherein the insulative element is mechanically attached at the first end to a rotatable screw-based lever accessible by a user, where the insulative element rotates into a position as to block a flow of power from a power supply to an electrical interconnection between two electrical contacts of an electronic device, the rotation occurring based on a twisting motion of the spiral tubing or a rotational motion of the rotatable screw-based lever.

According to another aspect, an apparatus to prevent a flow of power to an electronic device is provided. The apparatus includes a first and second electrical interconnect that, when contacted, create a closed switch to provide power to an electronic device as through a flow of power from a power supply; a first and a second attachment plate, wherein the first attachment plate mechanically attaches to the first electrical interconnect and the second attachment plate mechanically attached to the second electrical interconnect; a hygroscopic polymer mechanically attached to the first and second attachment plates, wherein the hygroscopic polymer swells when impacted by moisture thereby preventing the first and second electrical interconnects from making an electric connection; a housing enclosing the hygroscopic polymer, the housing including a first housing component, the first housing component attaching to the first attachment plate; and a second housing component, the second housing component attaching to the second attachment plate, where each housing component contains at least one aperture to permit air flow, through the housing, to contact the hygroscopic polymer; at least one electromagnet mechanically attached to the first housing component, and electrically connected to at least one of the first and or second electrical interconnects; at least one ferromagnetic disk mechanically attached to the second housing component; and a rotatable screw-based lever mechanically attached to one of the first or second attachment plate.

BRIEF DESCRIPTION OF THE DRAWINGS

FIG. 4 is a schematic cross-sectional diagram of an interlock mechanism according to an embodiment.

DETAILED DESCRIPTION OF PREFERRED EMBODIMENTS

Due to shipping electronic equipment (e.g., hardware) in colder climates (e.g., when the shipping vehicle has no form of temperature control, and all shipped materials are subject to the conditions of the surrounding environment), the equipment can be subject to a cold environment. The temperature of the hardware/equipment may be lower than a dew point temperature of the environment surrounding the equipment. The dew point is the temperature at which water vapor in the air will condense. If and when the equipment is moved to a warmer location, the moisture in the warmer air comes in contact with the equipment and may condense on one or more surfaces of the equipment.

When outdoor temperatures are very cold, the amount of time needed for the equipment to warm up, or acclimate, to the warmer temperature may be extensive. As a result, ice is likely to form if the temperature of the equipment is below the freezing point of water. Depending on the temperatures of the location in which the equipment is held, the moisture can then freeze and form a layer of ice on the equipment.

The amount of ice formed would vary with the temperature of the equipment and the moisture content of the indoor air. The formation of condensation or a thin layer of ice on the product is relatively common. However, damage to the equipment can occur if the condensation has not evaporated inside the machine. In these cases, if the equipment is powered-on, there is the risk of short-circuiting printed wiring board traces or permanently damaging various hardware components.

Embodiments are directed to a network of sensors (e.g., temperature, humidity) and control circuits that protect electronic equipment from premature power-on in the event the interior of the equipment does not meet certain environmental conditions (e.g., not dry). Embodiments also provide computer-based intelligence to receive communications from a sensor, make a determination as to the amount of time necessary to allow a power-on sequence to begin, without risk to the equipment, for example through heat and moisture mass transfer calculations. Embodiments also provide an override mechanism that can be used in cases where a sensor fails to report on environmental conditions and a user of the equipment still chooses to initiate the power on sequence.

Figure 1:
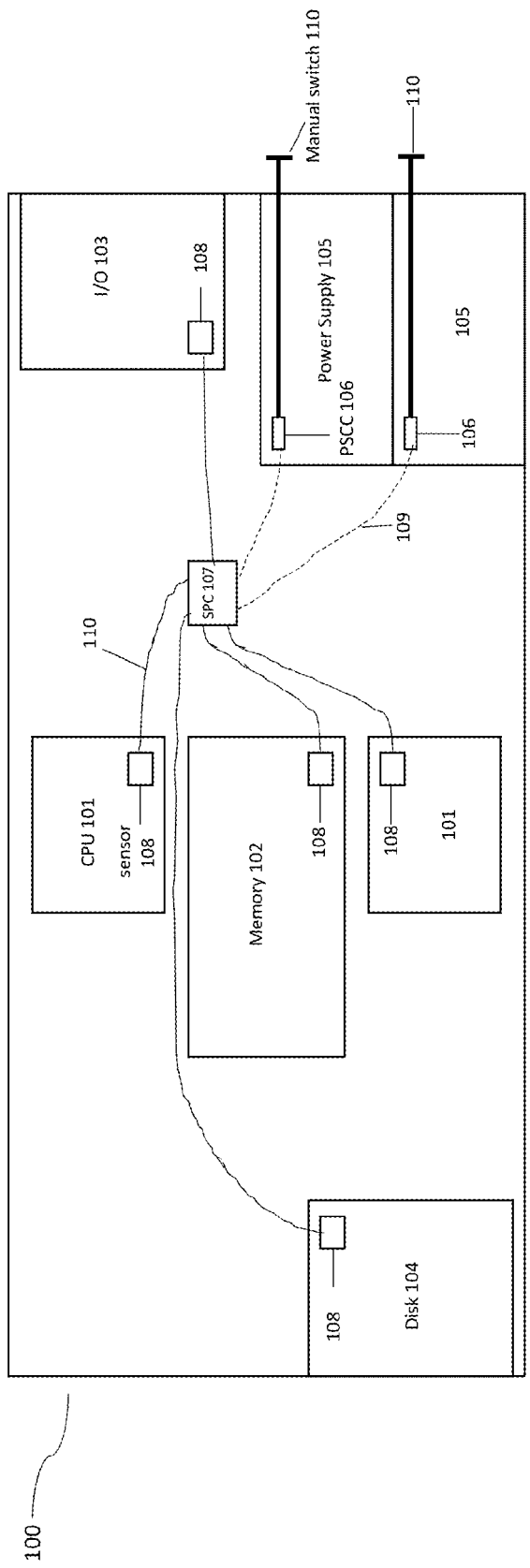
FIG. 1 is a schematic diagram depicting components of a control system integrated with components of an electronic device according to an embodiment.

"Electronic equipment", used herein, means a device, unit, hardware, or machine that is powered by an internal and/or external power source. As depicted in FIG. 1, acclimation system 100 integrates with the electronic equipment. As is provided in further detail below, the equipment, connected to its power source, has its power-on sequence initiated and controlled by a service processing circuit and a power supply control circuit.

FIG. 1 depicts acclimation system 100. Service processing circuit 107 (hereinafter, may be referred to as "SPC") can be operatively coupled to one or more power supply control circuits 106 (hereinafter, may be referred to as "PSCC"). PSCC 106 can be operatively coupled to a power supply 105. Power supply 105 supplies power to the equipment, for example, through one or more battery packs (e.g., internally powered), or alternating or direct current power sources (e.g., externally powered). PSCC 106 serves to permit the flow or prevent the flow of power from a power source to the equipment.

As is provided in further detail below, PSCC 106 can have located within its structure a physical interlock mechanism, for example, a moisture, thermal, bimetallic, chemical or mechanical interlock mechanism. PSCC 106 can be located within one or more server or node power supplies, power distribution units (PDU), or a power cord of the electronic equipment. Electromechanically connected to PSCC 106 is the externally accessible manual switch 110.

Sensors 108 operate to measure environmental conditions, operating to obtain measurements based on temperature, condensation (e.g., presence of moisture), humidity, dew point, and similar conditions. Sensors 108 include, but are not limited to, temperature sensors, humidity sensors, barometric air pressure sensors and condensation sensors. Other sensors can also be used to generate measurements regarding environmental conditions, including dew point sensors.

Sensors 108 may take the form of wired sensors or may be wireless sensors. Sensors 108 can be placed at various locations internal and external to the electronic device to detect the environmental conditions. Sensors 108 may be mounted on conventional components of the electronic equipment. For example, sensors 108 may be mounted on disk unit 104, central processing unit (CPU) 101, memory 102, and input/output unit 103. Sensors 108 may also be mounted on an exterior (not shown) of the electronic device to measure external environmental conditions, as these conditions can affect conditions internal to the equipment. SPC 107 is operatively coupled to each of sensors 108 in order to request and receive measurements of environmental conditions when the equipment initiates its power-on sequence.

SPC 107 can be configured to perform as a data logger, obtaining and recording measurements from the plurality of sensors inside and outside the electronic device. SPC 107 can record measurements by means of a storage media contained within its unit. Given that SPC 107 and sensors 108 operate for a period of time when the electronic equipment is unpowered, they may rely on a separate and a specifically configured powered source (not shown), such as a battery pack, or chargeable power source (i.e., source charged when electronic device is powered on).

Figure 2:
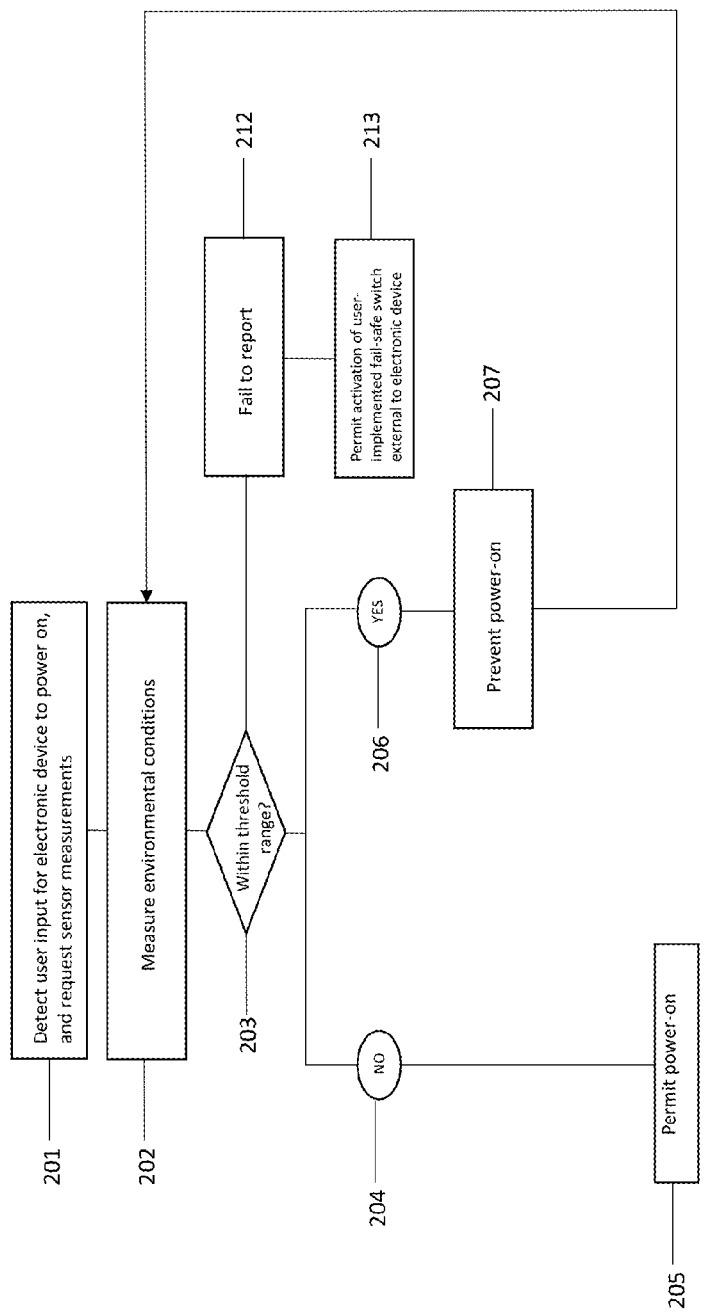
FIG. 2 is a flowchart depicting a method to control the flow of power to an electronic device based on measured environmental conditions according to an embodiment.

FIG. 2 shows a flowchart of a method of controlling power flow to an electronic device in accordance with an embodiment. FIG. 2 is discussed below with reference to components shown in FIG. 1.

At 201, SPC 107 detects a user input for the electronic device to initiate its power on sequence. The user input may be represented by a user initiating the power-on sequence by the press of a button, or through an automated (e.g., pre-set timer) power-on sequence. Once detected, SPC 107 requests measurements from sensors 108 enabled to capture environmental conditions internal and external to the device. At 202, in response to a request sent to sensors 108, conditions are measured, recorded, and transmitted to SPC 107. In one embodiment, when the electronic device is unpowered, SPC 107 sends a request for temperature, humidity and condensation measurements. Continuing with this example, sensors 108 obtain readings of the environmental conditions. It is understood that sensors 108 may be of a sensor type to obtain multiple, or a combination of, environmental conditions within a unitary sensor unit.

Once SPC 107 receives a response to its request for readings, it is determined whether the measured conditions are within a threshold range, 203. The threshold range provides values as a series of baseline conditions for powering on the equipment (e.g., minimum and maximum operating temperatures). These threshold values can conform to one or more conventional industry standards. Without baseline conditions in place, the electronic device could be powered on in less than optimal conditions (e.g., in higher temperatures, in moist conditions) which can lead to the malfunction of one or more components of the equipment may occur. The threshold range can be a specified range, based on pre-set, factory-based specifications. For example, based on the mass of the equipment and the maximum operating conditions of the equipment, a temperature and humidity range can be pre-set. A maximum wetness specification of the equipment may also be determined, for example, from lab testing.

At 204, when measured conditions are within the threshold range, SPC 107 permits initiating the power-on sequence, 205. In other words, PSCC 106 does not obstruct the flow of power to power supply 105, and power is permitted to flow normally through the equipment. As mentioned above, the threshold value can conform to industry standard. For example, certain standards specify that temperatures can range from −40° F. to 140° F. (−40° C. to 60° C.) in the shipping and storage environment. As another example, the range could be defined as the range between the dew point of the operating environment and the maximum operating temperature for the equipment in that environment, based on ASHRAE class A1-A4; operating envelopes could be used as the threshold range. As provided here and in the description above, threshold ranges can be associated with temperature ranges. However, the description of temperature ranges is provided by way of example only and are not intended to limit the threshold ranges so as to exclude, for example, threshold ranges, based on dew point ranges, barometric pressure ranges, and other ranges known to one skilled in the art.

At 206, when measured environmental conditions are not within the threshold range, i.e., outside the threshold range, SPC 107 prevents the powering-on of the equipment, 207, with an interlock mechanism. As mentioned above, embodiments provide a temperature-driven interlock mechanism and a moisture-driven interlock mechanism, each of which is described further herein. Irrespective of the mechanism in place to prevent the powering-on of the electronic device, SPC 107 monitors and measures, via sensors 108, the internal and external environmental conditions to determine when the conditions whether conditions are within or outside a threshold range Once an initial power-on sequence is prevented due to irregular environmental conditions, the process of monitoring and measuring in the unpowered mode can be continuous, until proper conditions are detected to permit powering-on the equipment. This is represented by the methodology returning to 202 from 207. The continuous process can be terminated, for example, when the equipment is switched to an off-position. Such an action would indicate to SPC 107 that a user is no longer seeking the advance the power-on sequence, and therefore there is no need for SPC 107 to continuously monitor and measure environmental conditions.

Figure 3:
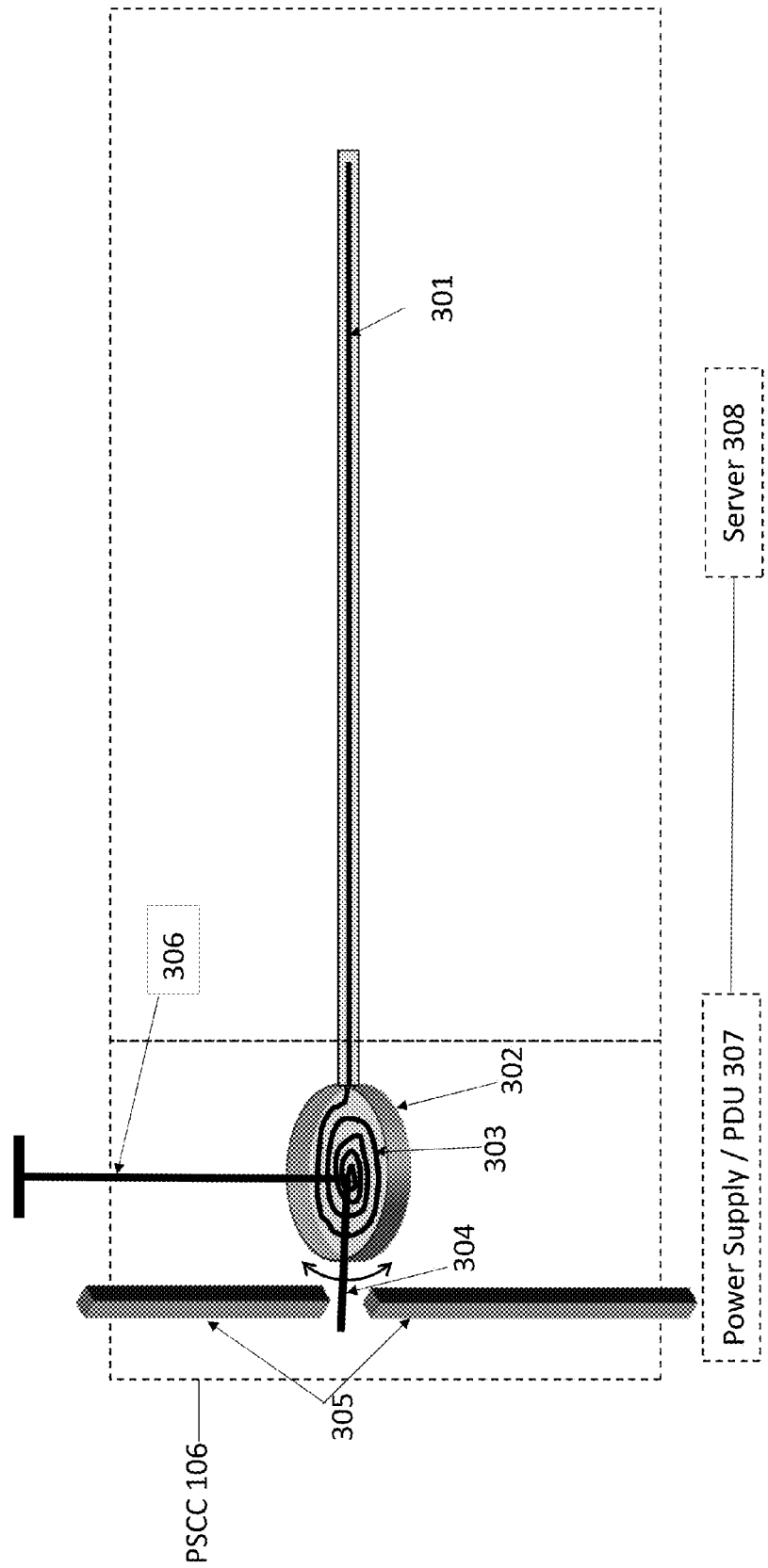
FIG. 3 is a perspective diagram of an interlock mechanism according to an embodiment.

At 212, when SPC 107 requests measurements from sensors 108, in one embodiment, SPC 107 permits a manual power-on sequence to be initiated when one or more of sensors 108 fails to report, 213. For example, as shown in FIGS. 3 and 4, a user can manually activate a switch (this switch corresponds to externally accessible manual switch 110) located on the exterior of the electronic device. The switch can come in the form a pull-lever that, once pulled by the user, creates a closed circuit through PSCC 106, thereby permitting power flow to the electronic device. In this embodiment, acclimation system 100 in operation, bypasses use of the aforementioned interlock mechanisms that would be triggered by SPC 107. The continuous process of monitoring and measuring environmental conditions, 208-211, can also be terminated by the user manually activating the switch.

The following description provides embodiments directed to passive interlock mechanisms in accordance with embodiments of the present disclosure and FIGS. 3 and 4. These interlocks do not require control input from SPC 107 to prevent a flow of power to the electronic device. However, key features of the interlocks can be combined with an active driver such as a stepper motor or solenoid to engage the described interlocks. The active-type interlock mechanisms can work in concert with SPC 107 to prevent a flow of power to the electronic device by reacting to a control input from SPC 107. The interlock mechanisms can also be located within PSCC 106.

FIG. 3 depicts an embodiment of an interlock mechanism that can be used in acclimation system 100. FIG. 3 depicts a temperature-driven interlock mechanism (hereinafter, "TDIM") that includes flexible probe tube 301, canister 302, spiral tubing 303, electrically insulative element 304 and, electrical interconnects, or contacts, 305, and externally accessible switch 306. Flexible probe tube 301 can extend to other parts of the equipment, such as the CPU and memory. Flexible probe tube 301 may be made of thing walled stainless steel that can be manipulated and placed where needed. Flexible probe tube 301 can also be made of a stiffer polymer such as polyether ether ketone (PEEK). Flexible tube 301 is filled with a fluid with a high coefficient of thermal expansion (CTE), for example, ethyl alcohol or kerosene. Although this embodiment provides fluids with a CTE of greater than $500\times10^{-6}$/K, it is understood that one skilled in the art may use other fluids with similar CTE properties. Flexible probe tube 301 is mechanically and fluidically attached to spiral tubing 303 element. Canister 302 encloses probe tube 301 and spiral tubing 303. Spiral tubing 303 may also be filled with a high coefficient of thermal expansion fluid such as ethyl alcohol or kerosene. Spiral tubing 303 may be made of some thin-walled stainless steel or stiffer polymer such as PEEK.

Electrically insulative element 304 is made of a non-conducting material, for example, plastic. Electrically insulative element 304 acts an obstructing element. Electrically insulative element 304 is mechanically attached at one end of its body, within canister 302, to a one end of spiral tubing 303. Insulative element 304 is also mechanically attached at the same end of its body to a lever 306, further described herein. Mechanical attachments include those conventional in the art, including but not limited to, soldering insulative element 304 to each of spiral tubing 303 and lever 306. Based on its position relative to electrical interconnects 305, when certain environmental conditions are achieved, for example, through sensing a temperature of the surrounding environment, the high CTE fluid contained in flexible probe tube 301 will either contract or expand. Sensing a temperature of the environment can be associated with a predetermined, or preset, threshold range of temperature that may activate the high CTE fluid; depending on the high CTE fluid used, the temperature range can be predetermined and customized for particular environments.

In operation, when the high CTE fluid is below a temperature threshold, e.g., cold, and the electronic device is unpowered, the high CTE fluid contracts. The act of contraction of probe tube 301 generates a force within probe tube 301 that causes spiral tubing 303 to rotate the insulative element 304. This movement forces spiral tubing 303, within canister 302, to twist in a direction as to move electrically insulative element 304 into a position between electrical interconnects 305. By resting in a position between electrical interconnects 305, interconnects 305 are not permitted to make contact, thereby creating an open switch. Therefore, power flow from power supply, or PDU 307, is obstructed to server 308. Server 308 represents an example of a type of electronic equipment or some component of the equipment that makes use of acclimation system 100. The temperature threshold can be associated with the properties of the high CTE fluid.

As another example, when the high CTE fluid is equal to or above a temperature threshold, e.g., not cold, and the electronic device is unpowered, the high CTE fluid expands, thereby forcing spiral tubing 303, within canister 302, to twist in an opposite direction to move insulative element 304 into a position not between electrical interconnects 305. By resting in a position not between electrical interconnects 305, interconnects 305 can make electrical contact, creating a closed switch, permitting power to flow from PDU 307 to server 308. Engaging a conventional power switch of the electronic device causes the electrical interconnects 305 to move and close a circuit to allow power to flow to the rest of the system. However, if electrically insulative element 304 is in a position in between electrical interconnects 305, then the interconnects cannot come together to create a closed switch. Under normal operation of the electronic device, there is no forcible contact between electrical interconnects 305. The temperature threshold can be associated with the properties of the high CTE fluid.

Even when configured with the TDIM, when the electronic device is powered on, electrical interconnects 305 are closed and insulative element 304 cannot interfere with the electrical connection. In other words, when electrical interconnects 305 are in a closed position, there is no pathway, e.g., space between, for electrically insulative element 304 to obstruct power flow between the interconnects 305. Therefore, irrespective of what environmental conditions may actually exist internal and external to the equipment, the equipment remains operational if it was already powered-on. For example, this would avoid unintended shutdowns of the device if the temperature in a room where the equipment is stored (e.g., computer room, or a server room) increases or decreases beyond a specified temperature range. The temperature threshold at which point insulative element 304 obstructs electrical interconnects 305 can be determined experimentally and can be set and pre-configured or pre-programmed during factory calibration while installing acclimation system 100 on an electronic device.

As mentioned, TDIM has lever 306. Lever 306 is an embodiment of externally accessible manual switch 110, shown in FIG. 1. Lever 306 can be mechanically attached to element 304. Preferably, lever 306 is in the form of a rotatable, hand screw mechanism. A user can utilize the hand screw mechanism to rotate insulative element 304 into a position so as to not obstruct the electrical contact of interconnects 305; this permits power to flow from PDU 307 to an electrical interconnection between interconnects 305 to power an electrical component, e.g., server 308, of the electronic device. Lever 306 can also be used as a type of fail-safe switch—when sensors of acclimation systems 100 do not respond, e.g., inoperative, the user can enable power flow by rotating lever 306, thereby moving insulative element 304 into a position so as to not obstruct the electrical contact of interconnects 305.

Another embodiment of an interlock mechanism is shown in FIG. 4, moisture-driven interlock mechanism (hereinafter, "MDIM"). The MDIM includes polymer 401, attachment plate 402a, 402b (collectively, 402), electromagnets 403a, 403b (collectively, 403) ferromagnetic disk 404a, 404b (collectively, 404) housing 405, including 405a-h, electrical interconnects 408a, 408b (collectively 408), and externally accessible switch, or lever, 407. Polymer 401 is porous and is hygroscopic. Polymer 401 can be made of nylon, although it is understood that some other hygroscopic material can be used. Preferably, polymer 401 has a negligible CTE so that temperature changes do not interfere with the intended operation of MDIM.

Housing 405 can be composed of at least two portions, a first housing component 405a, 405b, 405c, 405d (collectively 405i) and a second housing component 405e, 405f, 405g, 405h (collectively 405j). In an embodiment, 405a-d make a single, whole, unitary component, and 405e-f make a single, whole, unitary component, thereby creating two halves of housing 405. In another embodiment, 405b acts as an element that mechanically connects, e.g., interlocks, with 405c, so as to mechanically connect 405a and 405d. In another embodiment, 405b and 405c make up a single unitary portion that attaches to 405a and 405d, respectively. In another embodiment, 405f acts as an element that mechanically connects, e.g., interlocks, with 405g, so as to mechanically connect 405e and 405h. In another embodiment, 405f and 405g make up a single unitary portion that attaches to 405e and 405h, respectively.

Housing 405 can made of plastic. Housing 405 encloses polymer 401 and is mechanically attached to attachment plates 402. Housing 405 provides mechanical support and protection to the MDIM while still allowing air to reach polymer 401 through apertures 410. Similarly, attachment plates 402 provide mechanical support to the polymer and the MDIM.

In some embodiments, first housing component 405i mechanically attaches, e.g., soldered, to first attachment plate 402a. First attachment plate 402a mechanically attaches to first electrical interconnect 408a. Second housing component 405j mechanically attaches to second attachment plate 402b. Second attachment plate 402b mechanically attaches to second electrical interconnect 408b. Polymer 401 mechanically attaches to the first and second attachment plates, 402a, 402b.

In some embodiments, at least one of electromagnets 403 can mechanically attach to second housing component 405j. One or more electromagnets 403 can also be encased within second housing component 405j. Electromagnets 403 are electrically connected to at least one of the first and second electrical interconnects 408a, 408b. Electromagnets 403a, b mechanically attach to second attachment plate 402b. At least one of ferromagnetic disks 404 can mechanically attach to first housing component 405i. Ferromagnetic disks 404a, b can mechanically attach to first attachment plate 402a.

Ferromagnetic disks 404 are arranged on housing 405 to oppose electromagnets 403. The relative orientation of electromagnets 403 and ferromagnetic disks 404, i.e., arranged on opposite sides of housing 405, permits the natural forces known in electromagnetism to occur; in other words, the attractive and repulsive forces between the two components drive movement of attachment plates 402, along with first and second housing component 405i and 405j, and therefore, electrical interconnects 408a and 408b. Lever 407 mechanically attaches to one of the first and second attachment plates 402a, 402b. Mechanical attachments, as mentioned herein, include those conventional in the art, including but not limited to, soldering.

When polymer 401 is moist, or impacted by moisture e.g., via condensation that has formed, and the electronic device is unpowered, polymer 401, absorbs moisture and swells, thereby separating first and second attachment plates 402a, 402b, so as to disconnect the first and second electrical interconnects in, i.e., pushes electrical interconnects 408 apart. This creates an open switch. Therefore, when the power switch is moved to the "on" position by a user, the contacts are open and the electronic device will not power-on. When polymer 401 is dry and the electronic device is unpowered, for example, when the environment is dry, polymer 401 dries out and contracts, thereby generating a natural force to unite first and second attachment plates 402a, 402b. This contracting movement exerts force on attachment plates 402, which are attached to electrical interconnects 408, and interconnects 408 are moved into a position so as to contact. Therefore, when the power switch is moved to the "on" position by a user, the contacts are closed and the electronic device is able to power-on based on the permitted power flow.

Continuing with this embodiment, when the electronic device is powered, interconnects 408 are closed and power flows through electromagnets 403. Electromagnets 403 magnetically couple to ferromagnetic disks 404 and ensure that interconnects 408 stay connected, i.e., as to create a closed switch. When electrical interconnects 408 are in a closed position, and power is flowing through the closed circuit, electromagnets 403 are powered, and electromagnets 403 electrically attract ferromagnetic disks 404. In this embodiment, electrical interconnects can remain in a closed position, even if the environmental conditions internal and external to the equipment vary at future points in time. For example, this avoids premature or unintended shutdowns when a room in which the equipment is contained, e.g., a computer room, or a server room, reaches a relative humidity, or moisture level, that above the threshold value that would normally trigger the interlock mechanism so as to prevent a flow of power from PDU 409 to the electronic device. The moisture threshold and dimension of polymer 401 at which point interconnects 408 make contact can be experimentally determined and designed. Based on the material composition of polymer 401, particular hygroscopic properties can be employed in sensing a level of moisture within a particular environment, and more specifically, permitting a threshold, or particular, range of levels of moisture to affect the operation of polymer 401.

As mentioned, the MDIM has externally accessible switch 407. Switch 407 is an embodiment of externally accessible manual switch 110, FIG. 1. Preferably, a user utilizes a hand screw mechanism, as switch 407 when one or more sensors do not report measurements on environmental conditions to SPC 107. In one embodiment, acclimation system 100 calculates a minimum wait time, "t_hours" or $t_{hrs}$, for the user to activate the switch to commence the power-on sequence based on the following equation:

$$t_{hrs} = -2 \times t_c \times \ln\left(\frac{T - T_{final}}{T_{initial} - T_{final}}\right),$$

where $t_c$ is the time constant of the system generated by empirical testing, and is defined as m*Cp/h*A, where m is mass, Cp is specific heat, h is the heat transfer coefficient (due to natural and forced convection) on the surface of an object and A is the surface area of that object from which heat transfer is taking place;

T is the current temperature of a measurement point within or on the electronic system being monitored;

$T_{initial}$ is the initial temperature of a measurement point, within or on the electronic system, being monitored when the electronic system was moved from a shipping environment to a staging, or destination, environment;

$T_{final}$ is the temperature of the staging environment that the electronic system has been moved into from the shipping environment.

In an embodiment, time constant $t_c$ is determined from empirical test data and is calculated in response to the temperature and dew point values being greater than 2 degrees Celsius apart.

Acclimation system 100 can then display a message to a user of the electronic device, where the message indicates that the electronic device can commence the power-on phase through use of a user-engaged manual lever. For example, the message can be electronically communicated to a display, such as a conventional graphical user interface, located at the user's workstation or mounted on or near the electronic equipment being serviced by acclimation system 100. A user can then use the screw as a fail-safe switch, to override the SPC 107 and the interlock mechanism and initiate the power-on sequence of the equipment. Taking the embodiment employing MDIM, in a case of malfunctioning sensors, e.g., false or no reporting by one or more sensors, a user exerts a force on the hand screw mechanism, thereby resulting in a force exerted on the upper plate, and the upper plate is forced into contact with the lower plate to create a closed switch between electrical interconnects and a flow of power to electronic device.

What is claimed is:

1. An apparatus to prevent a flow of power to an electronic device, comprising:
   a flexible, fluid-filled probe tube;
   a spiral, fluid-filled tube, mechanically and fluidically attached to the probe tube;
   a canister, in which the probe tube and spiral fluid-filled tube are enclosed;
   an electrically insulative element, wherein the insulative element is mechanically attached at a first end, within the canister, to a first end of the spiral tube, and wherein the insulative element is mechanically attached at the first end to a rotatable screw-based lever accessible by a user,
   wherein the insulative element rotates into a position as to block a flow of power from a power supply to an electrical interconnection between two electrical contacts of an electronic device, the rotation occurring based on a twisting motion of the spiral tubing or a rotational motion of the rotatable screw-based lever.

2. The apparatus of claim 1, wherein the rotation of the insulative element is caused by sensing a temperature of a surrounding environment.

3. The apparatus of claim 1, wherein when a fluid within the probe tube is below a temperature threshold and the electronic device is unpowered, the fluid contracts, thereby generating a force within the probe tube that causes the spiral tube to rotate the electrically insulative element between the two electrical contacts.

4. The apparatus of claim 1, wherein when a fluid within the probe tube is above a temperature threshold and the electronic device is unpowered, the fluid expands, thereby generating a force to rotate the insulative element into a position not between the two electrical contacts.

5. The apparatus of claim 2, wherein sensing a temperature is based on a predetermined threshold range associated with the fluid contained within the probe tube.

6. The apparatus of claim 1, wherein the rotatable screw-based lever is externally accessible by the user.

7. The apparatus of claim 1, wherein the probe tube is filled with kerosene or ethyl alcohol.

8. The apparatus of claim 1, wherein the probe tube is made of polyether ether ketone.

9. An apparatus to prevent a flow of power to an electronic device, comprising:
   a first and second electrical interconnect that, when contacted, create a closed switch to provide power to an electronic device as through a flow of power from a power supply;
   a first and a second attachment plate, wherein the first attachment plate mechanically attaches to the first electrical interconnect and the second attachment plate mechanically attached to the second electrical interconnect;
   a hygroscopic polymer mechanically attached to the first and second attachment plates, wherein the hygroscopic polymer swells when impacted by moisture thereby preventing the first and second electrical interconnects from making an electric connection;
   a housing enclosing the hygroscopic polymer, the housing comprising:
      a first housing component, the first housing component attaching to the first attachment plate; and
      a second housing component, the second housing component attaching to the second attachment plate,
      wherein each housing component contains at least one aperture to permit air flow, through the housing, to contact the hygroscopic polymer;
   at least one electromagnet mechanically attached to the first housing component, and electrically connected to at least one of the first and or second electrical interconnects;
   at least one ferromagnetic disk mechanically attached to the second housing component; and
   a rotatable screw-based lever mechanically attached to one of the first or second attachment plates.

10. The apparatus of claim 9, wherein swelling of the polymer is triggered by sensing a level of moisture.

11. The apparatus of claim 9, wherein when the polymer is moist and the electronic device is unpowered, the polymer swells, thereby separating the first and second attachment plates so as to place the first and second electrical interconnects in an open position to prevent the device from commencing a power-on phase.

12. The apparatus of claim 9, wherein when the polymer is not moist and the electronic device is unpowered, the polymer generates a force to unite the first and second attachment plates, thereby pulling the first and second electrical interconnects into a closed position.

13. The apparatus of claim 12, wherein when the electrical interconnects are in a closed position, and power is flowing through a closed circuit, thereby powering the electromagnet, and the powered electromagnet electrically attracts the ferromagnetic disk.

14. The apparatus of claim 10, wherein sensing the level of moisture is based on a predetermined threshold range.

15. The apparatus of claim 9, wherein the rotatable screw-based lever is externally accessible by the user.

16. The apparatus of claim 9, wherein the hygroscopic polymer is made of nylon.

17. The apparatus of claim 9, wherein the housing is made of plastic.

* * * * *